United States Patent
Vinet et al.

(10) Patent No.: US 9,634,103 B2
(45) Date of Patent: Apr. 25, 2017

(54) CMOS IN SITU DOPED FLOW WITH INDEPENDENTLY TUNABLE SPACER THICKNESS

(71) Applicants: COMMISSARIAT A L'ENERGIE ATOMIQUE ET AUX ENERGIES ALTERNATIVES, Paris (FR); STMICROELECTRONICS INC, Coppell, TX (US)

(72) Inventors: Maud Vinet, La Haye Fouassiere (FR); Laurent Grenouillet, Rives sur Fure (FR); Qing Liu, Guilderland, NY (US)

(73) Assignees: Commissariat à l'énergie atomique et aux énergies alternatives, Paris (FR); STMICROELECTRONICS Inc., Coppell, TX (US)

( * ) Notice: Subject to any disclaimer, the term of this patent is extended or adjusted under 35 U.S.C. 154(b) by 0 days.

(21) Appl. No.: 14/782,190

(22) PCT Filed: Apr. 3, 2013

(86) PCT No.: PCT/IB2013/001017
§ 371 (c)(1),
(2) Date: Oct. 2, 2015

(87) PCT Pub. No.: WO2014/162164
PCT Pub. Date: Oct. 9, 2014

(65) Prior Publication Data
US 2016/0035843 A1    Feb. 4, 2016

(51) Int. Cl.
*H01L 29/417*    (2006.01)
*H01L 21/84*    (2006.01)
(Continued)

(52) U.S. Cl.
CPC .. *H01L 29/41783* (2013.01); *H01L 21/31133* (2013.01); *H01L 21/32* (2013.01);
(Continued)

(58) Field of Classification Search
CPC ............... H01L 29/41783; H01L 21/32; H01L 29/6656; H01L 21/31133; H01L 29/0653;
(Continued)

(56) References Cited

U.S. PATENT DOCUMENTS 8,236,634 B1    8/2012 Kanike et al.
2010/0323484 A1    12/2010 Fukushima
(Continued)

OTHER PUBLICATIONS

Anonymous "Structure and method of using oxidized silicon nitride as an etch-stop layer for wet chemistry etching of silicon nitride," IP.com Journal, XP013012609, Sep. 4, 2003, 6 pages.
(Continued)

*Primary Examiner* — John P Dulka
*Assistant Examiner* — Charles R Peters
(74) *Attorney, Agent, or Firm* — Oblon, McClelland, Maier & Neustadt, L.L.P.

(57) ABSTRACT

A method for manufacturing a microelectronic device with transistors of different types having raised source and drain regions and different overlap regions.

13 Claims, 6 Drawing Sheets

(51) Int. Cl.
*H01L 27/12* (2006.01)
*H01L 21/311* (2006.01)
*H01L 21/32* (2006.01)
*H01L 29/06* (2006.01)
*H01L 29/66* (2006.01)
*H01L 21/8238* (2006.01)

(52) U.S. Cl.
CPC .......... *H01L 21/84* (2013.01); *H01L 27/1203* (2013.01); *H01L 29/0653* (2013.01); *H01L 29/6656* (2013.01); *H01L 21/823814* (2013.01); *H01L 21/823864* (2013.01)

(58) Field of Classification Search
CPC ................ H01L 21/84; H01L 27/1203; H01L 21/823814; H01L 21/823864
See application file for complete search history.

(56) References Cited

U.S. PATENT DOCUMENTS

| | | | |
|---|---|---|---|
| 2012/0049284 A1* | 3/2012 | Doris | H01L 27/1211 257/350 |
| 2012/0261756 A1 | 10/2012 | Kanike et al. | |
| 2012/0286364 A1* | 11/2012 | Cheng | H01L 21/82341 257/369 |
| 2012/0292705 A1 | 11/2012 | Cheng et al. | |
| 2013/0240998 A1 | 9/2013 | Cheng et al. | |
| 2013/0249004 A1 | 9/2013 | Doris et al. | |

OTHER PUBLICATIONS

International Search Report issued Nov. 15, 2013 in PCT/IB2013/001017 filed Apr. 3, 2013.

* cited by examiner

CMOS IN SITU DOPED FLOW WITH INDEPENDENTLY TUNABLE SPACER THICKNESS

TECHNICAL FIELD

The present application relates to the field of microelectronic transistor devices and in particular those comprising transistors with raised source and drain regions.

The invention provides an improved method for making transistors of different types on a same substrate with raised source and drain regions.

STATE OF PRIOR ART

The metal-oxide-semiconductor field-effect transistor (MOSFET) is based on the modulation of charge concentration in a channel region by a MOS capacitance between a body electrode and a gate electrode located above the body and insulated from all other device regions by a gate dielectric layer.

Such transistor further comprises a source region and a drain region on each side of the channel region.

The design of source-to-body and drain-to-body junctions affects several characteristics of the transistor: the current-voltage (I-V) characteristics, the output resistance, and also the speed of the device through the loading effect of the junction capacitances, and finally, the component of stand-by power dissipation.

The capacitive effects are limited by implementing source and drain region that are raised, i.e. that are made of semi-conductor regions arranged above a semi-conductor layer in which the transistor channel is formed.

Drain induced barrier lowering of the threshold voltage and channel length modulation effects upon I-V curves can be reduced by implementing shallow junction extensions comprising overlap regions, i.e. small regions situated under insulating spacers and that can extend under the gate and allow to have a low resistance link between the channel and the source/drain regions.

The overlap regions can be implemented during an annealing step that enables to drive dopants of raised source and drain regions in the underlying semi-conductor layer.

When raised source and drain are of in situ doped type, a way to tune the overlap region of the transistors is to adjust the spacer thickness.

The problem arises of finding a new method for fabricating transistors with raised source and drain regions of different types.

PRESENTATION OF THE INVENTION

The present invention relates to a method for making a microelectronic device with different types of transistors, the method comprising the steps consisting of:

a) forming source and drain regions on either sides of a first transistor gate block on a substrate comprising a semi-conductor layer, said semi-conductor layer having a first region on which said gate block of said first transistor is lying and a second region on which a gate block of a second transistor is lying, b) forming on said first region and said second region of said semi-conductor layer: a bi-layer comprising a first layer based on a first dielectric material covered with a second layer, c) forming insulating spacers on sidewalls of said gate block of said second transistor by etching said first layer of first dielectric material whereas said second transistor is protected by said second layer of the bi-layer, d) forming source and drain regions on either sides of said second transistor gate block on said second region of said semi-conductor layer.

During step a), the gate block of the first transistor has sidewalls covered with insulating spacers, whereas the insulating spacers of the second transistor are formed during step c).

Thus, according to the invention, the insulating spacers of first transistor and second transistor can be independently adjusted.

The material of said second layer is selected so that said first dielectric material of said first layer of the bi-layer can be etched selectively over the material of said second layer.

The material of said second layer is preferably a material that can be isotropically etched.

The material of said second layer is preferably a material that can be selectively etched with respect to resist.

The second layer of the bi-layer can be made of second dielectric material.

The substrate can be of the semi-conductor on insulator type.

The semi-conductor layer on which raised source and drain are formed can be a thin layer and advantageously an extremely thin layer, i.e. with a thickness between 3 nm and 10 nm.

According to a possible implementation, said first dielectric material can be $Si_xN_y$.

According to a possible implementation, the second dielectric material can be $SiO_2$ or amorphous $HfO_2$.

Advantageously, the method can further comprise after step c) and prior to step d), a step consisting of reducing the thickness of the insulating spacers of the second transistor.

Such reduction can be conducted by etching said first dielectric layer whereas said second transistor is protected by the second layer of said bi-layer, said etching being a selective etch of said first dielectric material over the material of said second layer.

Thus, a tuning of the thickness of second transistor's spacers can be implemented. To obtain a fine tuning, the reduction of insulating spacers can be conducted by wet etch.

This wet etch can advantageously be conducted with a solution of $H_3PO_4$. Such solution enables to etch the first dielectric layer in particular when it is $Si_xN_y$ based, without deteriorating the semi-conductor layer and/or the second layer of the bi-layer, in particular when said second layer is $SiO_2$ based. According to a possible implementation, the wet etch can also be conducted with a solution of HF-EG (Hydrofluoric acid+ethylen glycol).

According to a possible implementation, during step c), said second transistor can be protected by a photo-resist mask lying on said bi-layer.

Hence, the method further can comprise the removal of said photo-resist mask before said width reducing of insulating spacers.

According to a possible implementation, the method can comprise, prior to step a), the steps consisting of:
forming an insulating layer on said gate block of said first transistor and on said gate block of said second transistor,
forming said insulating spacers covering sidewalls of said gate block of said first transistor, by etching said insulating layer, whereas said insulating layer is kept on said second region.

Thus, the insulating spacers of said first transistor can be formed in said insulating layer whereas the insulating spacers of said second transistor can be formed only partly in said insulating layer.

The said second region can be covered by said insulating layer during step a), said bi-layer being formed during step b) so as to cover said insulating layer on said second region.

The insulating layer and the first dielectric layer can be made of the same material.

Advantageously, the insulating layer can be oxidised prior to step b) so that the oxidised surface of the insulating layer can play the role of an etch stop surface.

According to a possible implementation, the method can comprise after step b) and prior to step c): removing a zone of said second layer facing said second region whereas a zone of said second dielectric layer facing said first region is protected by a mask.

Insulating spacers formed on sidewalls of said gate block of said second transistor can be implemented so as to have a higher thickness than the thickness of insulating spacers formed on sidewalls of said gate block of said second transistor.

Thus, the distance between source and drain regions formed during step d) on either sides of said second transistor gate block and said gate block can be higher than the distance between source and drain regions formed during step a) on either sides of said first transistor gate block.

Thus, overlap region for the first transistor can be different from that of the second transistor.

Advantageously, the source and drain regions of said first transistor can be made of a first semi-conductor material for example adapted for a P-type transistor, whereas said source and drain regions of said second transistor are made of a second semi-conductor material, different from said first semi-conductor material, and for example adapted for an N-type transistor.

According to a possible implementation of the method, said first region and said second region can be separated by insulating trenches filled with a material that is identical to said second material, for example $SiO_2$ According to another aspect, the present invention relates to a microelectronic device comprising:
- a first transistor comprising a gate, a source region, a drain region lying on a semi-conductor layer of a substrate, said gate of said first transistor having sidewalls covered with insulating spacers,
- a second transistor comprising a gate, a source region, a drain region lying on said semi-conductor layer, said gate of said second transistor having sidewalls covered with insulating spacers,
- the distance between the gate and source/drain regions of the first transistor, being smaller than the distance between the gate and the source/drain regions of the second transistor.

Thus, overlap region for the first transistor can be different from that of the second transistor.

According to a possible implementation, the insulating spacers of said first transistor have a smaller thickness than said insulating spacers of said second transistor.

BRIEF DESCRIPTION OF THE DRAWINGS

The objectives and features of the present inventions as well as advantages thereof will become apparent from the following detailed description, considered in conjunction with the accompanying drawings.

It is to be understood, however, that the drawings, which are not to scale, are designed for the purpose of illustration and not as a definition of the limits of the invention, for which reference should be made to the appended claims.

The present invention can be the best understood through the following description and accompanying drawings, wherein.

DETAILED PRESENTATION OF PARTICULAR EMBODIMENTS

An example method according to the invention, for fabricating a microelectronic device with transistors comprising raised sources and drain regions will now be described with reference to FIGS. 1A-1M.

Figure 1A:
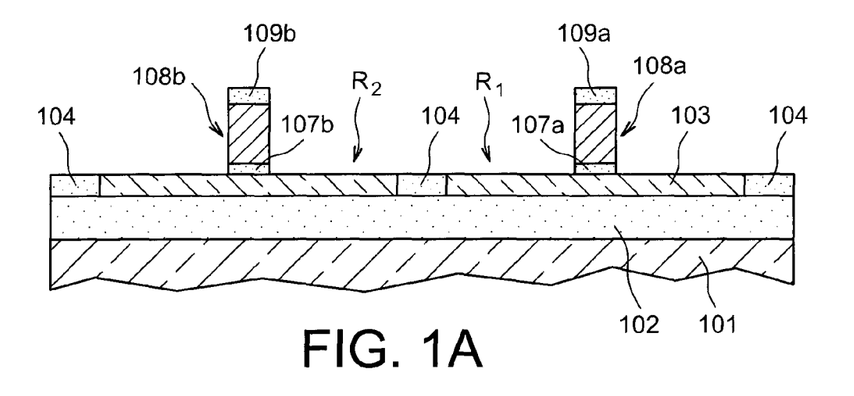
FIGS. 1A-1M show an example of a method according to the invention for fabricating on a same substrate a microelectronic device with transistors of different types and having raised source and drain regions.

The starting material can be a substrate of the semi-conductor on insulator type, for example of the SOI type (SOI for "Silicon On Insulator"), that comprises a semi-conductor support layer 101, an insulating layer 102 that can be based on silicon dioxide covering the support layer 101 and a thin semiconducting layer 103 on, and in contact with, the insulating layer 102.

A step of thinning the semi-conductor layer 103 can be achieved so as to render the semi-conductor layer extremely thin, i.e. with a thickness for example between 3 nm and 10 nm.

Isolation trenches 104, for example of the STI (STI for "Shallow Trench Isolation") type, can be formed in the thin semi-conductor layer 103 in order to electrically isolate at least a first region $R_1$ of the thin semi-conductor layer 103 on which a first type of transistor is intended to be disposed, from a second region $R_2$ on which a second type of transistor is intended to be placed. Isolation trenches 104 are filled with a dielectric material that can be for example $SiO_2$ based.

Gate dielectric deposition and gate material deposition are then performed followed by a patterning, so as to form on a first region $R_1$ of the thin semiconducting layer 103 a first gate dielectric 107a and a gate electrode 108a of a first transistor. During this step, a second gate dielectric 107b and a second gate electrode 108b of a second transistor are also formed on the second region $R_2$ of the thin semiconducting layer 103. First transistor is of a first type, for example of the PMOS type, whereas second transistor is of a second type, for example of the NMOS type.

Gate patterning can then be conducted by etching the gate dielectric material and the gate material through hard masks 109a, 109b. These hard masks 109a, 109b can be kept after said etching, respectively on top of the gate 108a of the first transistor and on top of the gate 108b of the second transistor (FIG. 1A).

Figure 1B:
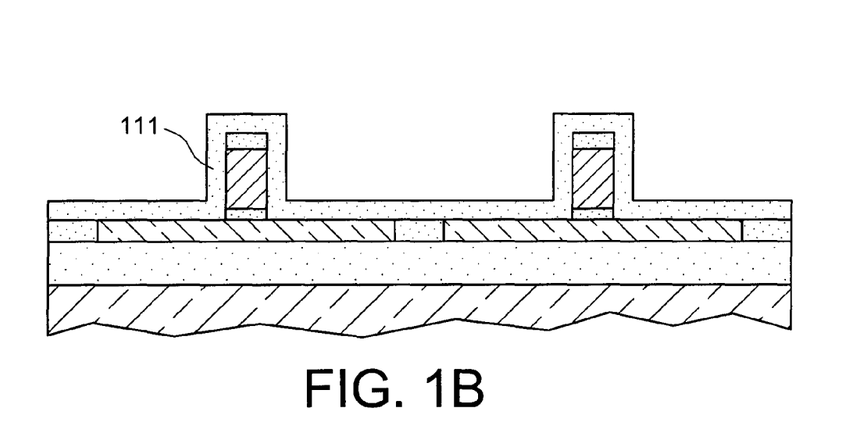

An insulating layer 111 is then deposited on the first region $R_1$ and on the second region $R_2$ so as cover the top and the sidewalls of the first gate 108a and of the second gate 108b. The insulating layer 111 can for example be a silicon nitride based or boron nitride based or SiOC based or SiOF based layer of a thickness for example between 3 nm and 15 nm (FIG. 1B).

Then, insulating spacers 112a are formed on the sidewalls of the first gate 108a (FIG. 1C), for example by anisotropic reactive ion etch of said insulating layer 111 through a mask 114, for example made of photo-resist. The mask 114 is disposed on said second region $R_2$ and thus protects from etching a zone of the insulating layer 111 facing said second region $R_2$ of the semi-conductor layer 103.

Figure 1C:
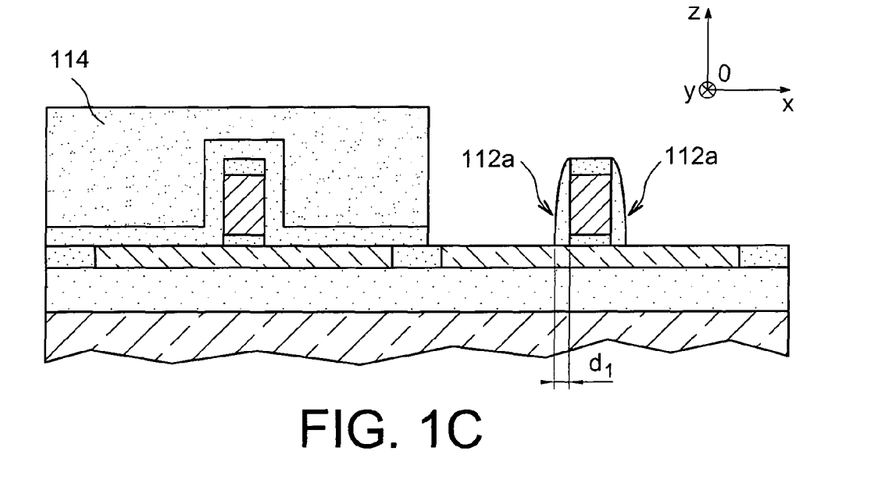

The insulating spacers 112a have a thickness $d_1$ (measured in a plan parallel to the principal plane of the substrate, the principal plane of the substrate being defined as a plane of the substrate that is parallel to plan [O;x;y] of orthogonal coordinate system [O; x; y; z]) in a zone in contact with the thin semi-conductor layer 103, that can be comprised for example between 2 nm and 15 nm.

The mask 114 can then be removed for example with a resist strip process.

Figure 1D:
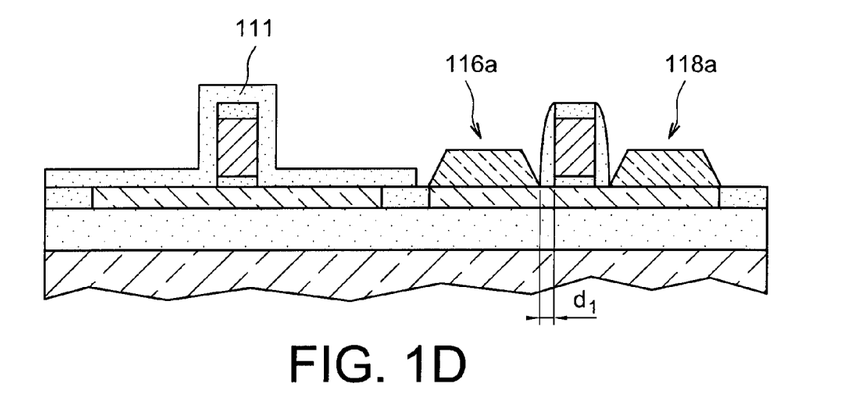

Semi-conductor regions 116a, 118a are then formed on each side of the first gate 108a, so as to form raised source and drain regions for the first transistor $T_1$ (FIG. 1D).

Semi-conductor regions 116a, 118a can be grown on the semi-conductor layer 103 by epitaxy. During this epitaxy step, the insulating layer 111 protects the second region $R_2$ of the thin semi-conductor layer 103. Thus, semi-conductor material is not grown on the second region $R_2$. An in situ doping can be performed during growth of semi-conductor regions 116a, 118a of the first transistor. Raised source and drain regions 116a, 118a are formed from a first semi-conductor material for example SiGe and are doped with a doping specie such as Boron.

A first annealing step can then be performed just after this epitaxy step, in order to drive dopants from the raised source drain regions in a region located under the spacers so as to electrically connect the source and drain and the channel.

Insulating spacers 112a that were formed before raised source and drain regions of the first transistor $T_1$ keep the raised source and drain regions 116a, 118a at a distance equal to $d_1$ or substantially equal to $d_1$ from the gate 108a of the first transistor and thus from the channel region of the first transistor $T_1$ situated in semi-conductor layer 103.

Figure 1E:
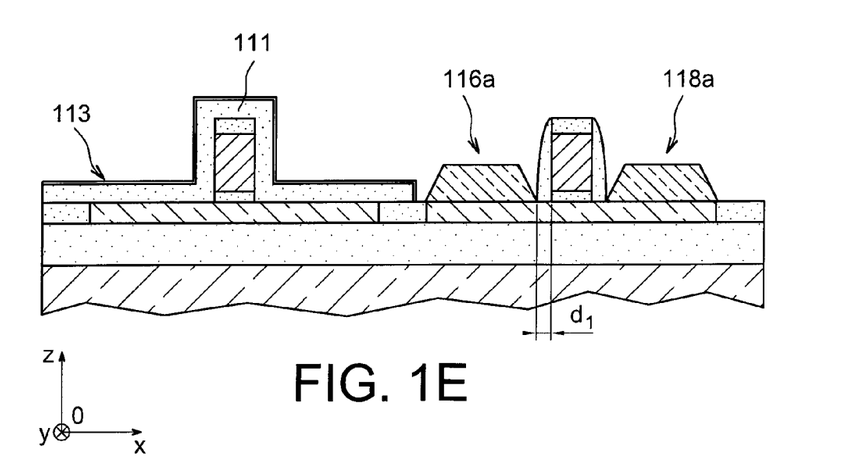

Then, the surface of the insulating layer 111 can be oxidized. Such step can be performed with an $O_2$ plasma or with an oxidizing solution such as SC1 (SC1 for "standard cleaning 1") comprising $NH_4OH:H_2O_2:H_2O$ solution. The oxidised surface 113 of the insulating layer 111 can further act as an etch stop layer (FIG. 1E). Semi-conductor regions 116a, 118a are advantageously made of a semi-conductor material that is not oxidised during this step, such as SiGe or Si for example.

Figure 1F:
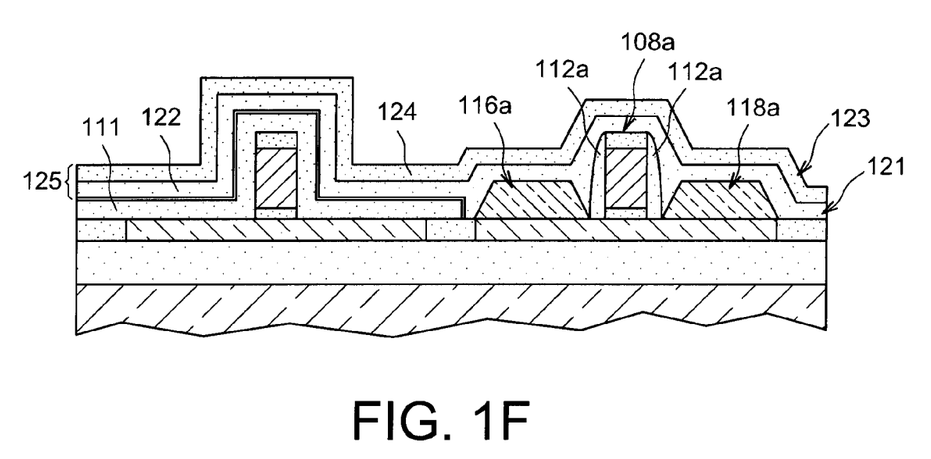

A stack 125 or "bi-layer" 125 comprising a first layer 121 of a first dielectric material 122 and a second layer 123 of a second material 124, is then deposited on said first region $R_1$ and on said second region $R_2$ of the thin semi-conductor layer 103 (FIG. 1F).

The first dielectric material 122 is chosen so that it can be selectively etched over the second dielectric material 124. The first dielectric layer 121 can further be based on a material 122 that can be selectively etched over the dielectric material of the insulating trenches 104.

The first dielectric layer 121 and the insulating layer 111 can be be made of the same material, for example a silicon nitride $Si_xN_y$ based material.

The second layer 123 is preferably made of a dielectric material 124 that can for example be silicon oxide, for example of TeOS type or of HTO type (HTO for "High Thermal Oxide"), or that can for example be $HfO_2$. Thus, the second dielectric layer 123 and the insulating trenches 104 can be based on the same material, for example $SiO_2$.

The first dielectric layer 121 has a thickness for example between 3 nm and 7 nm, whereas the second layer 123 has a thickness for example between 3 nm and 15 nm.

In a zone facing the second region $R_2$ of the thin semi-conductor layer 103, first dielectric layer 121 of the stack 125 covers and is in contact with the insulating layer 111, whereas in a zone facing the first region $R_1$ of the thin semi-conductor layer 103, the first dielectric layer 121 of the stack 125 covers and is in contact with, raised source region 116a, raised drain region 118a, the insulating spacers 112a situated on sidewalls of the gate 108a and a hard mask 109a that is situated on the top of the gate 108a (FIG. 1F).

Figure 1G:
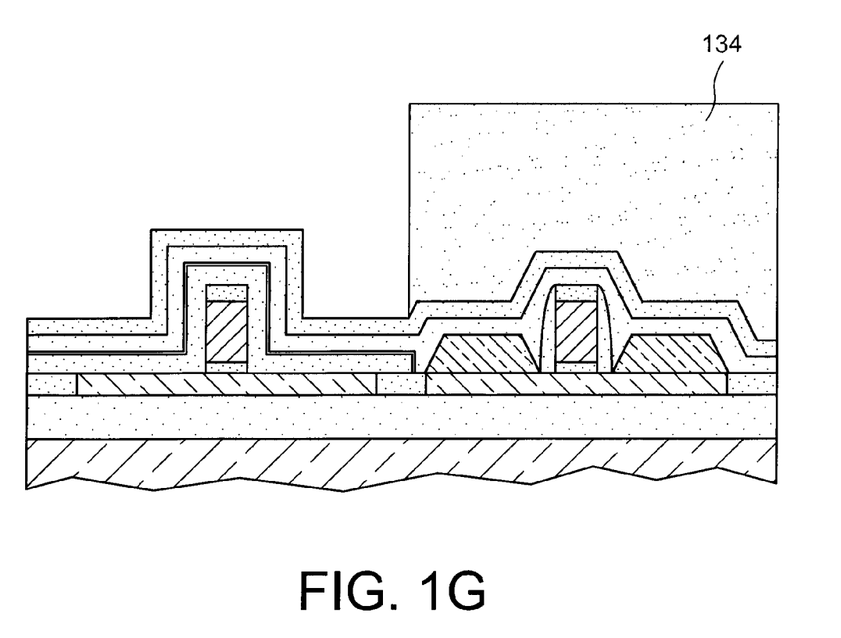

In a zone facing the first region $R_1$ of the semi-conductor layer 103, a mask 134, for example made of photoresist, is then formed on the second layer 123 of the stack 125 (FIG. 1G).

Figure 1H:
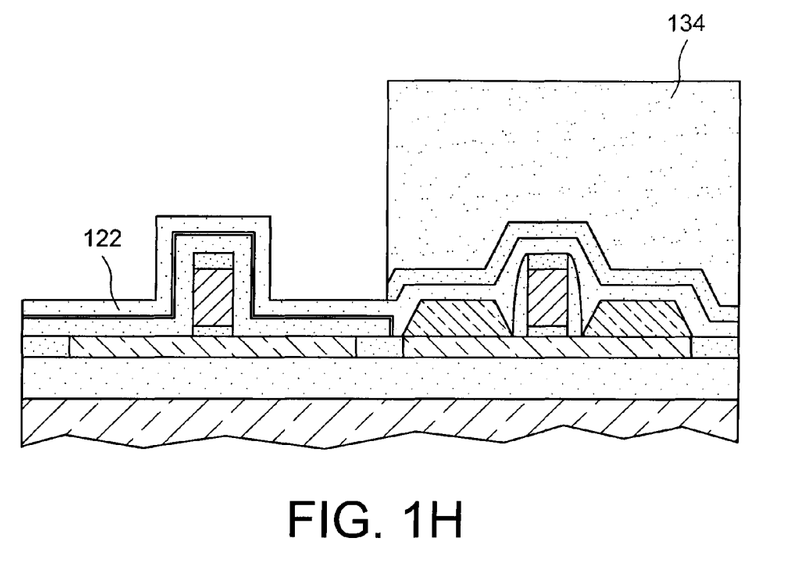

Outside a zone facing the first region $R_1$ and in particular in a zone facing the second region $R_2$ that is not protected by the mask 134, the second layer 123 of the stack 125 is then removed (FIG. 1H). Such removal step can be performed by etching using for example Buffered oxide etch (BOE) process, also known as buffered HF or BHF. Such process enables to conduct etching without degrading or removing the mask 134 or the first dielectric layer 121.

A formation of insulating spacers 142a for the second transistor $T_2$ is then performed (FIG. 1H). This can be done by etching for example of Reactive Ion Etching (RIE) type, so that a stack made of the insulating layer 111 and the first dielectric layer 121 is kept on the sidewalls of the second gate 108b of the second transistor $T_2$. The insulating spacers 142a for the second transistor are thus thicker than spacers 112a of the first transistor.

The insulating spacers 142a have a thickness (measured in a plan parallel to the principal plane of the substrate) $d_2$ in a zone which is in contact with the thin semi-conductor layer 103, such that $d_2 > d_1$, $d_2$ being for example between 2 nm and 15 nm wider than $d_1$.

Figure 1I:
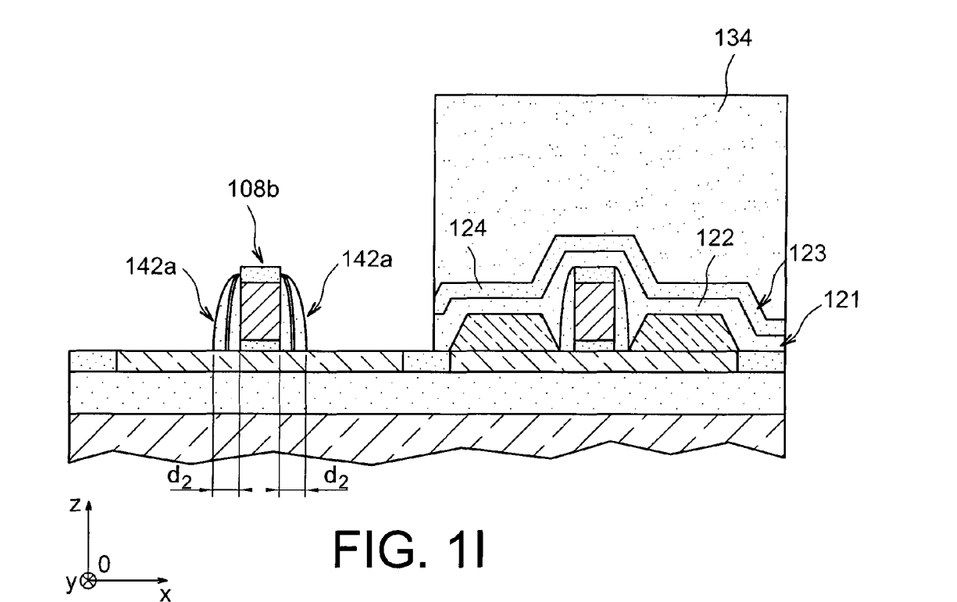

Then, the mask 134 is removed, for example with the help of a resist strip process (FIG. 1I).

Figure 1J:
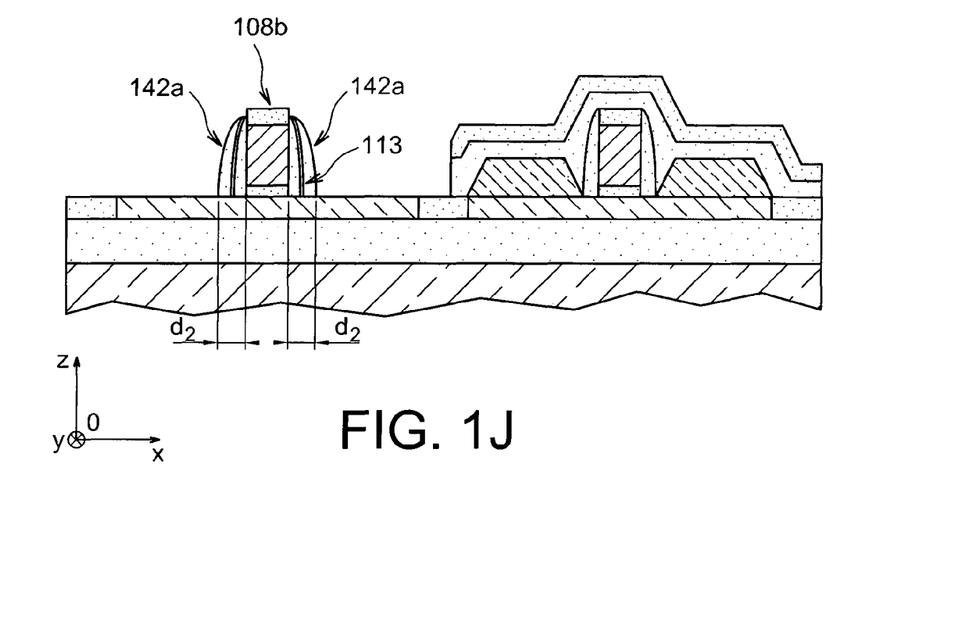
Figure 1K:
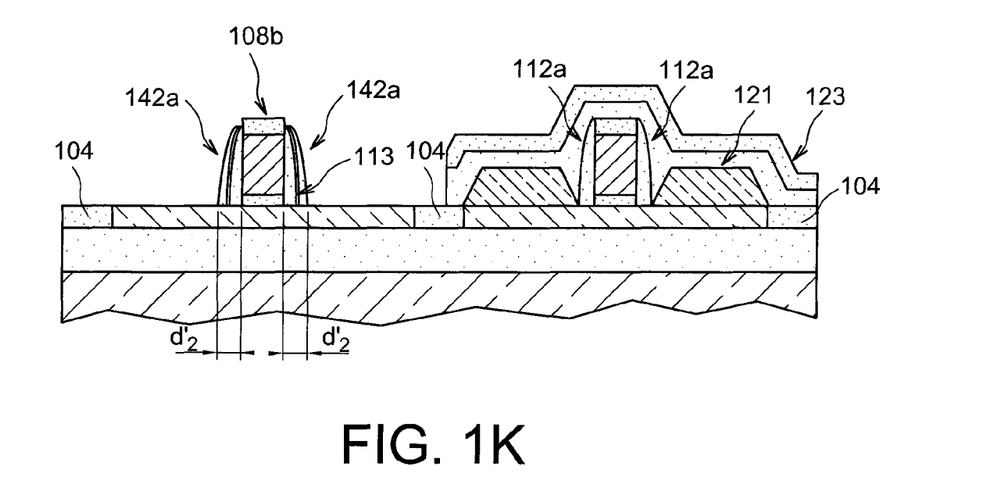

An adjustment of the insulating spacers 142a thickness can then be performed so as to reduce the insulating spacers 142a thickness.

Such step is preferably conducted with a wet etching solution so that finely tune removal of portion of the spacers 142a thickness can be obtained. Such step is preferably conducted with a wet etching solution provided so that it can remove a thin portion of the spacers 142a thickness of the order of several nanometers, for example 1 or 2 nm, without degrading semi-conductor layer 103 (FIG. 1J).

This step can be conducted for example by using a solution of $H_3PO_4$.

During this reduction step, in a zone facing the first region $R_1$ the source 116a and drain 118a regions of the first transistor are protected by the second layer 123 of the stack 125.

In the event dielectric material 122 is silicon nitride based, the use of $H_3PO_4$ enables to etch a portion of the dielectric material 122 on the sidewalls of the second gate, without deteriorating the STI isolation trenches 104, or the second layer 123 of the stack, in particular when said second layer 123 and said isolation trenches are silicon oxide based.

According to other examples, this adjustment step can be performed with the use of an etch solution based on NF3+NH3/H2 of SiConi™ type or HF-EG (hydrofluoric acid diluted by ethylene glycol) or Chemical Oxide Removal (COR) based on $NH_3/HF$. In this case, the second layer 123 of the stack 125 acts as a buffer layer and can be partially etched.

During the reduction step, the oxidised surface 113 of the insulating layer 111 situated at the interface between insulating layer 111 and dielectric layer 121 can act as an etch stop layer.

After adjustment (FIG. 1K), the insulating spacers 142a have a thickness (measured in a plan parallel to the principal plane of the substrate) d'2 in a zone which is in contact with the thin semi-conductor layer 103, such that d2≥d'2, d'2 being comprised for example between 3 and 15 nm.

Figure 1L:
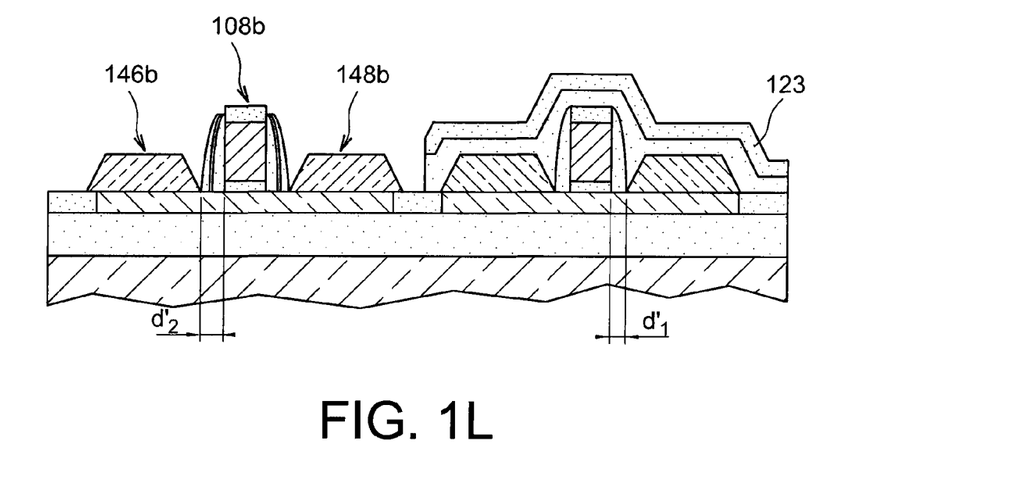

Semi-conductor regions 146b, 148b are then formed on each side of the second gate 108b, so as to form raised source and drain regions for the second transistor T2 (FIG. 1L). These semi-conductor regions 146b, 148b can be grown by epitaxy and for example be based on SiC. During this epitaxy step, the first transistor is protected by said stack 125.

The raised source and drain regions 146b, 148b are formed at a given distance $d'_2$ from the gate 108b of the second transistor $T_2$ and thus from the channel region of the second transistor $T_2$. The distance $d'_2$ depends on the insulating spacers zones 142a thickness and can be provided so as to be higher or lower than the distance $d'_1$ between source and drain regions 116a, 118a of the first transistor $T_1$ and the gate of the first transistor $T_1$. During growth step, semi-conductor regions 116a, 118a can be in situ doped.

Figure 1M:
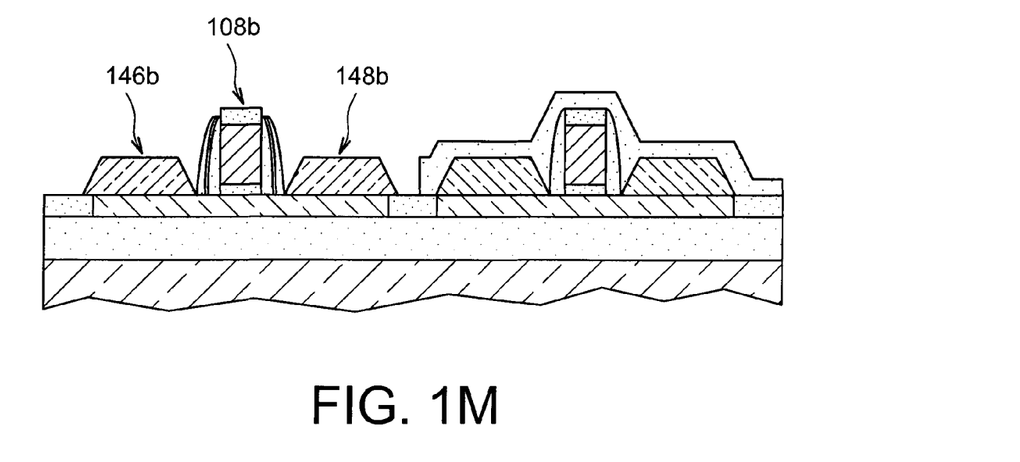

The second layer 123 of the stack can then be removed. Such removal can be done by selective etching over the first material on which spacers 142 are partially based. This etching step can advantageously be conducted by an epi cleaning step, i.e. a cleaning step subsequent to the epitaxy step (FIG. 1M).

An anneal step can then be performed so as to enable diffusion of dopants from the semi-conductor raised regions to the semi-conductor layer 103.

As the thickness of second transistor's insulating spacers 142a and the thickness of first transistor's insulating spacers 112a were tuned independently, the overlap regions defined by dopant diffusion from raised source/drain regions to layer 103 for the first transistor and for the second transistor are adjusted independently.

A silicidation of the semi-conductor regions 146b, 148b, 116a, 118a can then be carried out so as to form contacts. Said silicidation can comprise a deposition of a metallic material reacting with the respective semi-conductor material of the semi-conductor regions 146b, 148b on the one hand and 116a, 118a on the other hand. The metallic material used for silicidation may be constituted of a metal or of an alloy of metals such as nickel or platinum or titanium or, cobalt. One or more annealing step may then be carried out to complete silicidation.

The invention claimed is:

1. A method for making a microelectronic transistor device with different types of transistors, the method comprising:
    on a substrate including a semiconductor layer, the semiconductor layer having a first region on which a first gate block of a first transistor is lying, the first gate block of the first transistor having sidewalls covered with first insulating spacers, and a second region on which a second gate block of a second transistor is lying, forming first source and drain regions on either sides of the first gate block;
    forming on the first region and the second region a bi-layer including a first layer based on a first dielectric material covered with a second layer, the second layer of the bi-layer being based on a second dielectric material, then removing a zone of the second layer facing the second region whereas another zone of the second layer facing the first region is protected by a mask;
    forming second insulating spacers on sidewalls of the gate block of the second transistor by etching the first layer whereas the first transistor is protected by the second layer, then reducing second insulating spacers by etching the first dielectric layer whereas the first transistor is protected by the bi-layer, the etching being a selective etch of the first dielectric material over the second dielectric material;
    forming on the second region, source and drain regions on either sides of the second transistor gate block.

2. The method according to claim 1, further comprising, prior to the forming the first source and drain regions,
    forming an insulating layer on the first gate block and on the second gate block;
    forming the first insulating spacers by etching the insulating layer in the first region, whereas the insulating layer is kept on the second region.

3. The method according to claim 2, wherein the second region is covered by the insulating layer during the forming the first source and drain regions, the bi-layer being formed to cover the insulating layer on the second region.

4. The method according to claim 2, wherein the insulating layer is oxidized prior to the forming the bi-layer.

5. The method according to claim 1, wherein the second insulating spacers have a greater thickness than the thickness of first insulating spacers.

6. The method according claim 1, wherein during the forming the second insulating spacers, the first transistor is protected by the mask lying on the bi-layer, the method further comprising removing the mask before the reducing the second insulating spacers.

7. The method according to claim 6, wherein during the forming the second insulating spacers, the reducing the second insulating spacers comprises a wet etching.

8. The method according to claim 7, wherein during the forming the second insulating spacers, the wet etching is conducted with a solution of $H_3PO_4$.

9. The method according to claim 1, wherein the mask is a photo-resist mask, the removing the zone of the second layer facing the second region being conducted by selective etching of the second dielectric material.

10. The method according to claim 1, wherein the first region and the second region are separated by insulating trenches filled with a material that is identical to the second dielectric material.

11. The method according to claim 1, wherein the second dielectric material is made of $SiO_2$, and the first dielectric material is based on Silicon Nitride.

12. The method according to claim 1, the source and drain regions of the first transistor are made of a first semiconductor material, and the source and drain regions of the second transistor are made of a second semiconductor material, different from the first semiconductor material.

13. The method according to claim 1, wherein the substrate is of semiconductor on insulator type.

* * * * *